United States Patent
Gailus

(10) Patent No.: US 6,593,535 B2
(45) Date of Patent: Jul. 15, 2003

(54) DIRECT INNER LAYER INTERCONNECT FOR A HIGH SPEED PRINTED CIRCUIT BOARD

(75) Inventor: Mark W. Gailus, Somerville, MA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 09/892,045

(22) Filed: Jun. 26, 2001

(65) Prior Publication Data

US 2002/0195271 A1 Dec. 26, 2002

(51) Int. Cl.⁷ .............................. H01R 12/04; H05K 1/11
(52) U.S. Cl. ..................... 174/262; 174/261; 174/255; 174/260; 361/792; 361/795; 361/760; 439/65
(58) Field of Search .................................. 174/262, 261, 174/265, 264, 266, 250, 255, 260; 361/790, 792, 795, 760; 439/65

(56) References Cited

U.S. PATENT DOCUMENTS

| | | | |
|---|---|---|---|
| 3,276,106 A | | 10/1966 | Bester et al. |
| 3,322,880 A | * | 5/1967 | Bedell et al. ................ 174/261 |
| 3,446,908 A | | 5/1969 | Tally et al. |
| 3,660,726 A | * | 5/1972 | Ammon et al. ............. 174/262 |
| 3,964,813 A | | 6/1976 | Pizzeck |
| 3,971,610 A | | 7/1976 | Buchoff et al. |
| 4,030,792 A | * | 6/1977 | Fuerst ......................... 439/629 |
| 4,446,505 A | * | 5/1984 | Long et al. .................. 361/784 |
| 4,543,715 A | * | 10/1985 | Iadarola et al. ............. 174/261 |
| 4,562,301 A | | 12/1985 | Kameda et al. |
| 4,653,186 A | | 3/1987 | Kamijo et al. |
| 5,199,879 A | * | 4/1993 | Kohn et al. .................... 439/63 |
| 5,538,433 A | * | 7/1996 | Arisaka ....................... 174/266 |
| 5,565,654 A | * | 10/1996 | Zell et al. .................... 174/262 |
| 5,761,050 A | * | 6/1998 | Archer ........................ 361/744 |
| 5,823,830 A | * | 10/1998 | Wurster ....................... 439/751 |
| 5,909,011 A | * | 6/1999 | Chartrand et al. .......... 174/261 |
| 6,081,996 A | * | 7/2000 | Kruppa et al. ................. 29/834 |
| 6,083,340 A | | 7/2000 | Nomura et al. |
| 6,137,064 A | | 10/2000 | Kiani et al. |
| 6,303,879 B1 | * | 10/2001 | Burkhart ..................... 174/261 |

FOREIGN PATENT DOCUMENTS

| | | |
|---|---|---|
| DE | 4125018 | 1/1993 |
| EP | 0899842 | 3/1999 |
| EP | 1052732 | 11/2000 |
| JP | 403292792 A | * 12/1991 |

OTHER PUBLICATIONS

International Search Report from PCT/US02/19961.
Lennon P. S. et al., "Re–Establishing Interconnections in Multilayer Printed–Circuit Structures", IBM Technical Disclosure Bulletin, IBM Corp., Aug. 1978, vol. 21, No. 3, p. 980.
Anonymous: "System Comprising Densely Populated Coax Cable Terminations to Printed Circuit Board", IBM Technical Disclosure Bulletin, Dec. 1985, vol. 28, No. 7, p. 2985.

* cited by examiner

Primary Examiner—Kamand Cuneo
Assistant Examiner—I. B. Patel
(74) Attorney, Agent, or Firm—Daly, Crowley & Mofford, LLP

(57) ABSTRACT

A multi-layer printed circuit board includes a non-conductive via which intersects a conductive trace on an inner layer of the board and is adapted to receive a conductive element configured to make direct contact with the conductive trace. The non-conductive via may extend through all or only a portion of the multi-layer board. Illustrative conductive elements include a press fit contact, such as an eye-of-the-needle contact of an electrical component, a wedge-shaped contact, and a conductive polymer stripe. Also described is a stepped non-conductive via having a reduced diameter portion intersecting an inner layer conductor and a larger diameter portion. The stepped via is adapted to receive a conductive element having a reduced diameter portion in contact with the conductor and a larger diameter portion press-fit into the larger diameter portion of the via in order to mechanically secure the conductive element to the board.

14 Claims, 5 Drawing Sheets

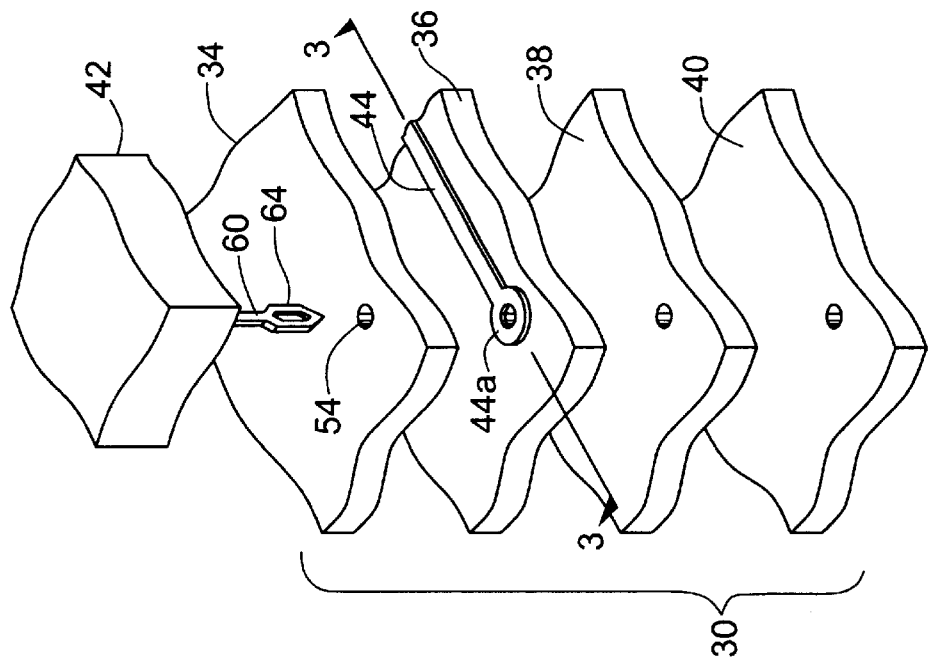
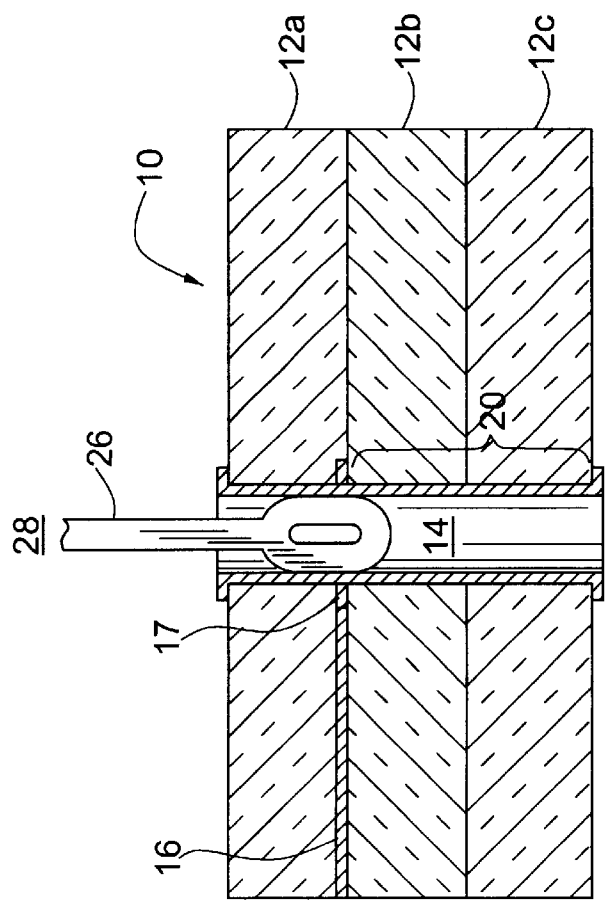
FIG. 2
FIG. 1
PRIOR ART

DIRECT INNER LAYER INTERCONNECT FOR A HIGH SPEED PRINTED CIRCUIT BOARD

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to printed circuit boards and more particularly to multi-layer printed circuit boards which carry high speed signals.

BACKGROUND OF THE INVENTION

As is known in the art, conductive traces are formed on printed circuit boards for carrying data signals and power between components mounted on the board. Space considerations often require the use of multi-layer printed circuit boards including multiple layered dielectric substrates with conductive traces formed on each substrate. The layered substrates are held together to make a printed circuit board that has conductive traces on different levels within the board.

In order to interconnect conductive traces on different layers, conductive vias extend between layers of the multi-layer printed circuit board. For this purpose, conductive vias intersect vertically aligned pads joined to conductive traces on different layers. Conductive vias also interconnect components mounted on the board to conductive traces on inner layers of the board. More particularly, a contact of the component, such as a press-fit pin, makes contact with the conductive walls of the via and the conductive walls of the via, in turn, contact one or more pads of conductive traces on inner layers of the board. Vias which extend through all layers of a multi-layer board are sometimes referred to as through holes.

Conductive vias are formed after the layered substrates are formed into a board. The vias are typically formed by drilling holes through at least a portion of the board and plating the walls of the holes with a conductive material, such as copper. Typically, a thin layer of copper is applied by an electroless process. An electrical potential is connected to this thin layer of copper and a thicker layer of copper is deposited over the thin layer by an electrolytic deposition process. In order to ensure reliable plating of the via walls, the aspect ratio of the printed circuit board thickness to the via diameter is limited. For example, for a circuit board having a thickness on the order of 0.25 inches (6.35 mm), the diameter of a plated via must be on the order of at least 0.018 inches (0.46 mm) requiring the hole to be on the order of 0.020 inches (0.51 mm) for plating thickness on the order of 0.002 inches (0.05 mm). This minimum via diameter limits the number of vias that can be provided in a given circuit board area.

An illustrative multi-layer printed circuit board 10 having a conductive via 14 is shown in FIG. 1 to include dielectric layers 12a, 12b, and 12c, with a conductive trace 16 formed on layer 12b. In the example, a three layer board is shown. It should be appreciated that the number of layers is selected for simplicity of illustration and the number of layers is not a limitation on the invention. However, the invention will be most useful with thicker boards. The conductive via 14 extends through a pad 17 of signal trace 16 in order to electrically interconnect to the signal trace 16. A pin 26 of a component 28 inserted at least partially into the via 14 contacts the conductive walls of the via and thus, is electrically connected to signal trace 16.

The high data rates of signals carried by printed circuit boards require careful attention to aspects of the circuit board structure affecting signal quality. As one example, portions of a conductive via extending beyond inner layers of the board which are interconnected to other layers and/or to a component mounted on the board, such as portion 20 of via 14, can act as a resonant stub, causing undesirable signal reflections at certain frequencies.

One solution to this problem is to use "blind" or buried vias for interconnecting traces on inner layers of a printed circuit board. A blind via extends from the surface of a board through only a portion of the layers of a multi-layer printed circuit board. It is, however, undesirable to make blind vias of multiple depths. Buried vias are used to interconnect two interior layers of the printed circuit board. Buried vias are formed by first making a subassembly from several layers of the printed circuit board. A hole is drilled through these layers and the hole is plated. Additional substrate layers are added to the top and the bottom of the subassembly to make a complete printed circuit board. The resulting buried vias are inaccessible and increase the manufacturing complexity of the multi-layer printed circuit board.

An alternative technique for eliminating resonant stubs formed by portions of conductive vias is to remove the stub portions of the via by drilling them out of the board. For example, by drilling a hole through layers 12b and 12c concentrically around, and with a larger diameter than the via 14, the via portion 20 extending through layers 12b and 12c is removed. However, this technique requires additional manufacturing steps.

SUMMARY OF THE INVENTION

It is an object of the invention to eliminate resonant stub portions of conductive vias in a multi-layer printed circuit board.

It is another object of the invention to provide an easily manufactured structure for making reliable electrical connection to a conductive trace on an inner layer of a multi-layer printed circuit board.

It is a further object of the invention to increase the component density achievable with a multi-layer printed circuit board.

These and other objects of the invention are achieved by providing a non-conductive via through at least a portion of a printed circuit board having a plurality of stacked dielectric layers with a conductive trace, or conductor formed on at least one inner layer. The non-conductive via intersects the conductor to expose a portion of the conductor. A conductive element extends into at least a portion of the via to contact the exposed portion of the conductor.

Because the via does not have a conductive coating, resonant stubs are not formed. A further advantage of the non-conductive via is that two conductive elements, such as contacts of two different electrical components, can be inserted into a single non-conductive via from opposite sides of the board in order to make direct electrical connection between the components and conductive traces on inner layers of the board. In this way, the circuit board density could be increased.

Generally, the conductive element is a contact of an electrical component mounted on the board. One illustrative conductive element includes an eye-of-the-needle portion configured for being press-fit into the non-conductive via. Another conductive element includes a serrated portion for contacting an inner layer trace. The conductive element may be comprised of a metal or a conductive paint or polymer.

The non-conductive via may extend through the entire board or through only a portion of the board. In one embodiment, the non-conductive via is tapered and the conductive element has a complementary taper such that the conductive element can be wedged into the non-conductive via to contact an exposed inner layer trace.

According to a further embodiment of the invention, a non-conductive via has a first, reduced diameter portion intersecting an inner layer conductor and a second, larger diameter portion located between the reduced diameter portion and a surface of the board. This "stepped" non-conductive via is adapted to receive a conductive element having a first reduced diameter portion for contacting the conductor and a second, larger diameter portion press-fit into the larger diameter portion of the via in order to mechanically attach the conductive element to the board.

With this arrangement, the portion of the conductive element in contact with the conductor can be provided with a smaller diameter than would be possible if this portion additionally provided the mechanical attachment mechanism to the board. In this way, the reduced diameter portion of the conductive element is optimized for electrical considerations and the larger diameter portion is optimized to provide a strong mechanical attachment to the board.

Also described is a conductive element configured to carry multiple signals and to make electrical contact to different conductors on one or more inner layers of the board. The multi-conductor element has a first portion adapted to contact a first conductor formed on an inner layer of the board and a second portion electrically isolated from the first portion and adapted to contact a second conductor formed on the same, or a different inner layer.

A method of making an electrical connection to a conductor on an inner layer of a multi-layer printed circuit board includes the steps of forming a non-conductive via through at least a portion of the board to intersect the conductor and inserting a conductive element into the via to contact the conductor.

BRIEF DESCRIPTION OF THE DRAWINGS

The foregoing features of this invention, as well as the invention itself, may be more fully understood from the following description of the drawings in which:

FIG. 1 is a partial cross-sectional view of a conventional multi-layer printed circuit board having a conductive via;

FIG. 2 is an exploded perspective view of a multi-layer printed circuit board having a non-conductive via with a conductive element in the via according to the invention;

DESCRIPTION OF THE PREFERRED EMBODIMENT

Figure 3:
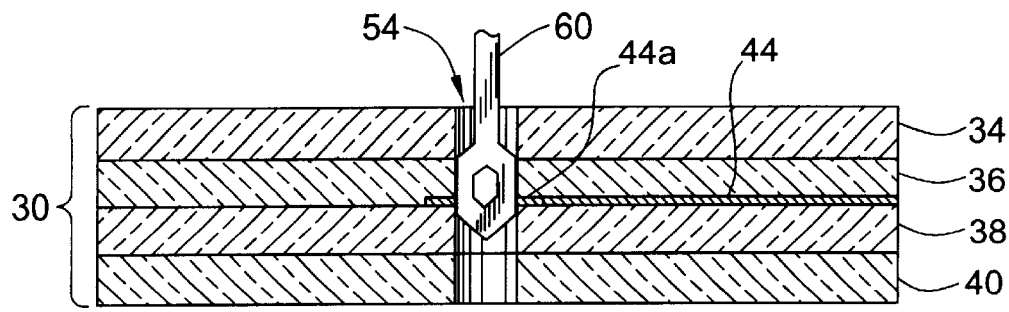
FIG. 3 is a partial cross-sectional view of the multi-layer printed circuit board of FIG. 2 taken along line 3—3 of FIG. 2.

Referring to FIG. 2, an exploded view of a multi-layer printed circuit board 30 shows a plurality of dielectric layers 34, 36, 38 and 40, at least one of which has a conductive trace 44 formed on a surface in a conventional manner, such as using photolithography. The conductive trace 44 is adapted for carrying a high speed signal and has a pad 44a joined to an end of the trace for facilitating electrical connection to the trace.

A non-conductive via 54 in the form of a non-plated hole extends through at least a portion of the dielectric layers 34–40 to intersect at least one conductive trace on an inner layer of the board. In the illustrative embodiment, the non-conductive via 54 extends through the entire board 30 and intersects the pad 44a of the conductive trace 44, thereby exposing a portion of the pad along the walls of the via 54.

The non-conductive via 54 is adapted to receive a conductive element 60 configured to contact the exposed portion of pad 44a. The conductive element 60 may take various forms with various features designed to provide reliable contact between the element and the exposed area of the trace 44 and/or pad 44a, as will be described. Generally, the conductive element 60 is a contact of an electrical component 42, such as a connector or integrated circuit, and may be referred to herein as contact 60.

With this arrangement, direct electrical contact between a component 42 mounted on the board 30 and an inner layer conductor 44 is achieved with a non-conductive via 54 which does not have plated via portions that can form a resonant stub. Additionally, manufacture of the printed circuit board 30 could be simplified if plating steps necessary to provide plated vias or plated through holes are not needed to manufacture other structures.

Each of the layers 34–40 of the printed circuit board 30 can be fabricated by conventional techniques. As one example, each of the dielectric layers 34–40 is comprised of fiberglass-reinforced epoxy resin with copper cladding. The copper is photolithographically processed to form a desired circuit pattern of conductive traces and pads on the surface of the layer.

The individually processed layers 34–40 are stacked and pressed into a printed circuit board by conventional techniques. A hole is drilled through the printed circuit board 30, as may be done by a conventional drill bit, by using laser drilling, by water jet drilling or other techniques, in order to form the non-conductive via 54. In the illustrative embodiment, the hole has a diameter on the order of between 0.010–0.018 inches (0.254–0.46 mm). This hole diameter permits more vias to be positioned in the same circuit board area as compared to conventional plated vias in which the plating itself has a thickness on the order of 0.002 inches (0.05 mm). This is because conventional plated vias are typically formed by plating a hole of at least 0.020 inches (0.51 mm) which, when coated, becomes a conductive via having a diameter on the order of 0.018 inches (0.46 mm).

It may be desirable to remove the insulator material of the layers 34–40 that may be spread along the walls of the via hole 54 during drilling, at least in the vicinity of the inner layer conductor 44. Various techniques are suitable for this purpose, including plasma and chemical etching. As one example, the epoxy resin material of the layers is removed from the walls by a known cleaning process, such as a chemical reduction process using potassium permanganate. Removing resin in the vicinity of the inner layer conductor serves to expose some of the trace 44 and may leave a small tab of the trace sticking into the hole. Such a tab would be bent down when the contact 60 is inserted, thereby resulting in a better connection to the contact.

In the embodiment of FIG. 2, the conductive element 60 is an eye-of-the-needle contact having a portion 64 designed to be press-fit into the non-conductive via 54. Other types of press-fit contacts are suitable and such contacts can be characterized generally by having at least a portion with a diameter greater than or equal to the diameter of the via 54. The contact 60 may have some resiliency imparted by the material of the contact and/or by features of the contact, such as the eye-of-the-needle portion 64. When the contact 60 is press-fit into the via 54, the eye-of-the-needle portion 64 deforms somewhat, but exerts a spring force outwards against the walls of the hole. Other forms of conductive elements may also be used, such as an expanding pin which is deformed and "mushrooms" out as it is pressed into the hole. Another type of expanding pin may be provided by a pin that expands when it is warmed up.

The conductive element 60 may be comprised of various materials, such as copper alloys, including beryllium copper. Preferably, the material will be suitably conductive and will also have sufficient mechanical properties to ensure that pressing the contact into the hole makes good electrical connection to the traces inside the hole throughout the life of the system. Alternatively, the conductive element may be comprised of a conductive paint or polymer, as described in connection with FIG. 7.

Various mechanical attachment mechanisms, other than press-fit, may be used to attach the conductive element 60 to the board 30. For example, a combination of pressure with heating and/or ultrasonic vibration applied to the contact 60 and/or to the board 30 may be used. The board 30 and/or conductive element 60 may be exposed to cooling, soldering, or solder reflow. A form of welding may be used by applying a controlled current versus time profile through a pair of pins connected to opposite ends of the printed circuit trace 44. Various techniques may be used in order to prevent the formation of oxides that may reduce the quality and/or reliability of the electrical interconnection, such as a flux, an air barrier material, nitrogen or an inert gas in the area of the connection between the contact 60 and trace 44. In order to enhance reliability, corrosion resistance, and electrical properties, various chemical platings, surface treatments, gels, coatings, corrosion resistant or air excluding materials may be applied to the contact 60 and/or inside the hole.

Multi-layer circuit boards generally include many vias, sometimes hundreds. It is within the scope of the invention that a printed circuit board, such as circuit board 30 of FIG. 2, includes both non-conductive vias according to the invention, like via 54, and conventional plated vias or through holes. Non-conductive vias might be drilled after conventional plated through holes are drilled. Alternatively, the non-conducting vias might be masked off during the electroless deposition step to ensure that no conductive material builds up on the inside walls of the holes.

In circuit boards containing a plurality of non-conductive vias 54, conductive elements 60 are inserted into respective vias 54 to different depths in order to make electrical connection to conductive traces formed on different inner layers of the board. When a single electrical component has a plurality of contacts, each inserted into a different non-conductive via, the contacts could have different lengths in order to facilitate their insertion into the board to different depths. Alternatively, sockets with different length contacts might be used to make contact with traces at different layers inside non-conductive vias. The components could then be mounted in the sockets.

It will be appreciated by those of ordinary skill in the art that a plurality of non-conductive vias, like via 54, formed in the circuit board 30 may have the same or different diameters and that the conductive elements, like element 60, inserted into such vias may be the same or different types of elements.

Various techniques may be used to insert the conductive element 60 into the via. For example, where the element is a contact of an electrical component 42, such as a connector having an insulating housing supporting a plurality of such contacts 60, the connector may be manually or machine inserted into the board 30. Alternatively, a plurality of discrete contacts 60 may be inserted individually into the board 30 and then an end of the contacts distal from the board is inserted into the insulating housing of the connector. In this case, special contacts and/or tooling may be used to insert the pins to different depths in the board.

Referring also to the cross-sectional view of FIG. 3, the conductive element 60 is shown in the via 54, in contact with the pad 44*a* of conductive trace 44. It will be appreciated by those of ordinary skill in the art that the conductive trace 44 need not have a pad. For example, the non-conductive via 54 can intersect the conductor 44 itself, thereby exposing a portion of the conductor along the via walls. However, in this embodiment, it is necessary that the conductive element 60 either be aligned in the hole to make contact with the trace or make contact at multiple points around the hole to be ensure it makes contact with the trace regardless of the orientation with which it is inserted.

In certain applications, it may be desirable to remove a portion of the dielectric layer supporting the conductive trace 44 in order to expose a larger portion of the trace 44 and/or pad 44*a* to which direct contact can be made by insertion of a conductive element into the via 54. During manufacture of a traditional printed circuit board, chemicals that preferentially remove the dielectric insulator material are sometimes used after the holes are drilled. This ensures that the ends of the traces are exposed on the inside of the hole before plating the inside of the through hole with conductive material. This step is sometimes called "desmearing." The same chemicals could be used to ensure the conductive traces on the inner layers are exposed for direct connection. Also, "etching back" is a known technique. This would leave a bit of the trace exposed as a tab to get pressed down and make good contact with the pin.

Figure 3A:
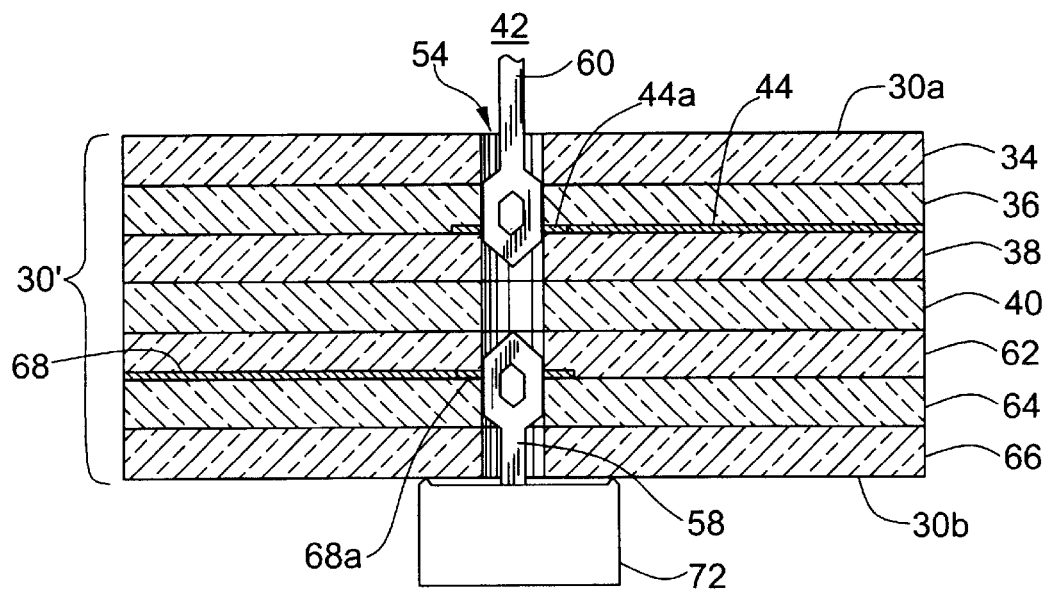
FIG. 3A is a partial cross-sectional view of a multi-layer printed circuit board having a non-conductive via with two conductive elements in the via according to the invention.

Referring also to FIG. 3A, in which like reference characters refer to like elements, a further advantage of the invention is illustrated by which two contacts from two different electrical components are inserted into the same non-conductive via 54. The circuit board 30' differs from circuit board 30 of FIG. 2 by including additional dielectric layers 62, 64, 66 with a second conductor 68 having a pad 68a formed on layer 64.

The contact 60 of component 42 (FIG. 2) is inserted part way into the non-conductive via 54 from a first surface 30a of the circuit board to contact conductive trace 44 and a contact 58 of a component 72 is inserted part way into the same via 54 from a second, opposite surface 30b of the circuit board to contact conductive trace 68, as shown. The two contacts 58, 60 are spaced from each other in order prevent electrical contact. This spacing may be achieved, for example, by interference between the component housings and the circuit board surfaces preventing further insertion of the respective contact. For example, the housing of component 70 contacts the surface 30b of the circuit board, preventing the contact 58 from being pushed any further into the non-conductive via 54.

The non-conductive via 54 of FIGS. 2, 3, and 3A extends through the entire circuit board. This arrangement simplifies manufacture of the circuit board since such non-conductive vias are similarly formed by drilling through the entire thickness of the circuit board. It will be appreciated by those of ordinary skill in the art however, that non-conductive vias may extend through only a portion of the circuit board and need only extend through enough of the board to intersect the conductive trace(s) to which electrical interconnection is desired.

Figure 4:
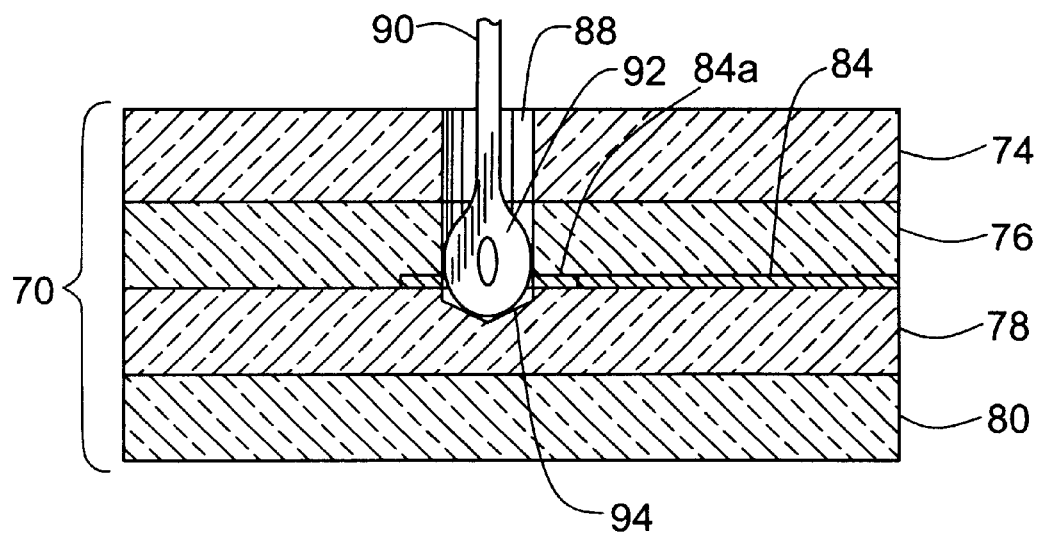
FIG. 4 is a partial cross-sectional view of a multi-layer printed circuit board having a non-conductive via extending through only a portion of the board with a conductive element in the via according to a further aspect of the invention.

Referring to FIG. 4, a multi-layer printed circuit board 70 includes dielectric layers 74, 76, 78, and 80 and a non-conductive via 88 extending through only a portion of the board. The non-conductive via intersects a pad 84a of a conductive trace 84 formed on layer 78 and terminates at a bottom wall 94, just beyond the pad 84a in layer 78, as shown.

A conductive element 90 in the form of an eye-of-the-needle contact of an electrical component is inserted into the non-conductive via 88 to contact the exposed pad 84a. In the illustrated embodiment, the contact 90 is inserted into the via until the eye-of-the-needle portion 92 contacts the bottom via wall 94. By precisely controlling the depth of the via 88, reliable contact between the conductive element 90 and the signal trace 84 is made. This is because the bottom wall 94 of the via 88 ensures that the contact 90 cannot be pushed too far into the via so as to pass the exposed pad 84a of the conductive trace 84.

Figure 5:
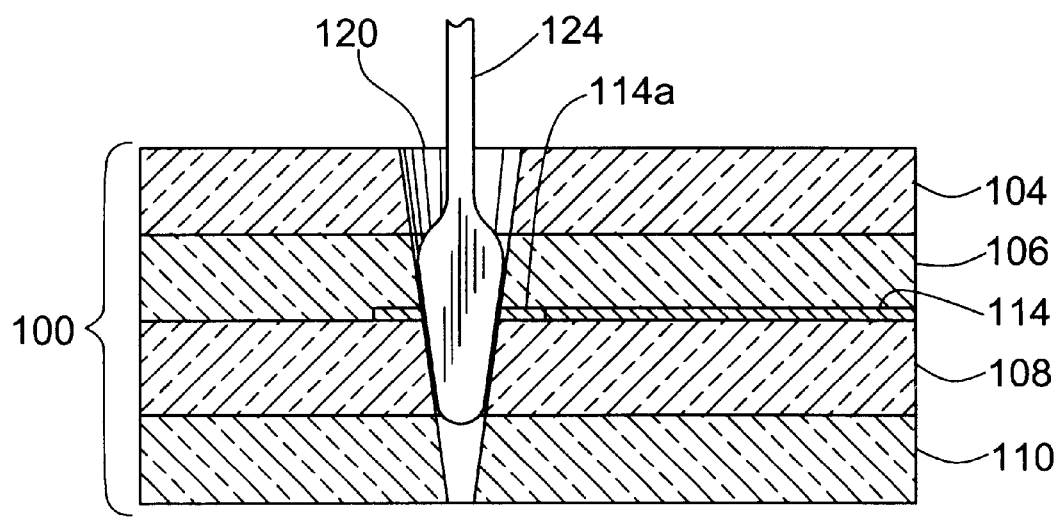
FIG. 5 is a partial cross-sectional view of a multi-layer printed circuit board having a tapered non-conductive via with a conductive element in the via according to a further embodiment of the invention.

It is not necessary that an eye-of the needle or traditionally shaped press fit contact be used. Referring to FIG. 5, a multi-layer printed circuit board 100 has a plurality of dielectric layers 104, 106, 108, 110, at least one of which has a conductive trace formed on a surface, as illustrated by conductive trace 114 formed on layer 108. A non-conductive via 120 is formed through the printed circuit board 100 to intersect a pad 114a of the conductive trace 114, as shown.

A conductive element 124 inserted into the via 120 to contact the exposed portion of the pad 114a. Conductive element 124 has a taper to give it a wedge shape. In use, the wedge-shaped element 124, as may be a contact of an electrical component, is pressed into the via hole 120. The wedge shape can create the required outward force as it is pressed into the hole, thereby making a good electrical contact to a trace surrounding the hole.

In FIG. 5, the non-conductive via 120 has a tapered, conical cross-section that generally matches that of the wedge-shaped contact 124. The angle of the taper is on the order of 2 to 5 degrees. With this arrangement, contact 124 can engage a trace inside the hole at many points along its length. Thus, the pad 114a that is exposed along a portion of the via walls is more likely to be engaged by the conductive element. Alternatively, the conductive element 124 may have a rectangular cross-section configured to be press-fit into the conical via 120.

Figure 6:
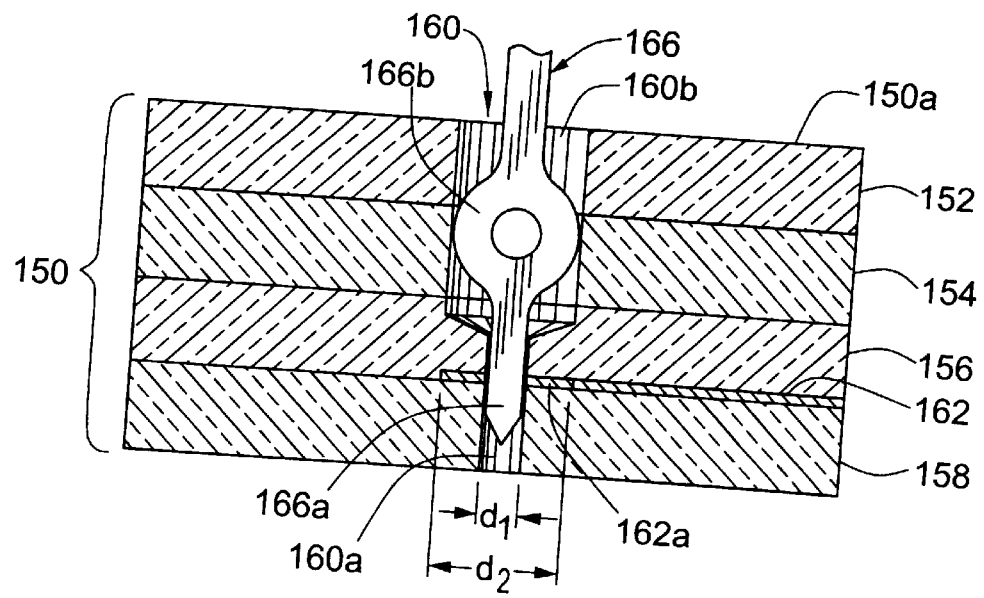
FIG. 6 is a partial cross-sectional view of a multi-layer printed circuit board having a stepped non-conductive via with a conductive element in the via according to an alternative embodiment of the invention.

Referring to FIG. 6, a multi-layer printed circuit board 150 has a "stepped" non-conductive via 160 with a first portion 160a of a first diameter d1 and a second portion 160b located between the first portion 160a and a surface 150a of the board and having a second, larger diameter d2. The board 150 has dielectric layers 152, 154, 156, and 158, at least one of which has a conductive trace formed on a surface, such as the illustrated conductive trace 162 formed on the surface of layer 156.

According to one technique for forming the stepped non-conductive via 160, a hole of diameter d1 is drilled through the entire board 150 and then a hole of larger diameter d2 is drilled concentrically around the hole of diameter d1, but through only a portion of the board not including the conductive trace 162. Thus, a pad 162a of the conductive trace 162 is intersected by the smaller diameter portion 160a of the non-conductive via 160, as shown.

A conductive element 166 is inserted into the non-conductive via 160 to make direct electrical contact to the pad 162a of the conductive trace 162. The conductive element 166, as may be a contact of an electrical component, has a first portion 166a adapted to be press-fit into the smaller diameter via portion 160a in order to contact the pad 162a and a second, larger diameter 166b adapted to be press-fit into the larger diameter via portion 160b in order to mechanically secure the contact to the board. The contact portions 166a, 166b have rectangular cross-sections but may alternatively have round or other shaped cross-sections.

With this arrangement, the contact portion 166b can be made relatively large as is desirable to provide a strong, reliable mechanical attachment to the board. Further, the contact portion 166a which makes electrical contact to the signal trace 162 can be made relatively small in order optimize electrical properties.

Figure 7:
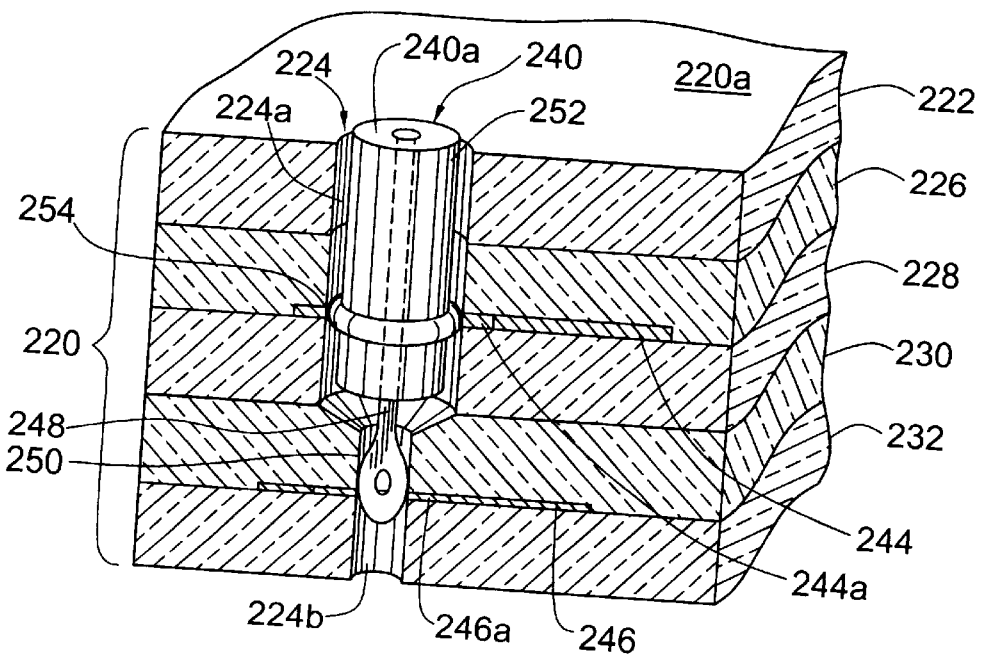
FIG. 7 is a partial cross-sectional view of a multi-layer printed circuit board having a non-conductive via with a multi-conductor element in the via in order to make electrical connection to multiple inner layer traces according to a further aspect of the invention.

Referring also to FIG. 7, a multi-layer printed circuit board 220 comprising stacked, dielectric layers 222, 226, 228, 230, and 232 has a "stepped" non-conductive via 224 with a smaller diameter portion 224a and a larger diameter portion 224b disposed between the smaller diameter portion and a surface 220a of the circuit board. The stepped non-conductive via 224 may be formed by the technique described above in conjunction with FIG. 6 and differs from the via 160 of FIG. 6 in that the via 224 intersects two conductors 244, 246. In the illustrative embodiment, the smaller diameter via portion 224a intersects the pad 246a of a conductive signal trace 246 and the larger diameter via portion 224b intersects the pad 244a of a ground plane 244.

The non-conductive via 224 is adapted to receive a conductive element 240 configured to make isolated electrical contact to the conductive trace 246 and ground plane 244. The multi-conductor element 240 includes an inner conductor 248 and an outer conductor 252. The inner conductor 248 and outer conductor 252 are mechanically coupled and are electrically isolated from one another such as with a dielectric fill between them in order to permit two electrical connections to be made. The multi-conductor element 240 forms the contact of an electrical component, such as an electrical connector having a dielectric housing in which a top surface 240a of the element 240 is encased.

The inner conductor 248 has an eye-of-the-needle portion 250 which is adapted to be press-fit into the smaller via portion 224a to contact with a pad 246a of trace 246. The outer conductor 252 of the element 240 has a press-fit portion 254 adapted to contact an exposed portion of pad 244a, as shown.

A multi-conductor element may be adapted to contact two or more electrically isolated conductors on the same circuit board layer. In the case of two conductors on the same layer, the two conductive traces are intersected by the same non-conductive via, thereby exposing a portion both traces. Upon insertion into the non-conductive via, a first portion of the multi-conductor element is aligned with and contacts with the exposed portion of one such trace and the second portion of the multi-conductor element is aligned with and contacts the exposed portion of the other trace. Suitable multi-conductor element for this purpose is shown in U.S. Pat. No. 6,137,064 to Kiani, et al. entitled SPLIT VIA SURFACE MOUNT CONNECTOR AND RELATED TECHNIQUES, which patent is hereby incorporated herein in its entirety.

It will be appreciated by those of ordinary skill in the art that various other forms of conductive elements adapted to be inserted into a non-conductive via for making direct contact with an exposed conductive trace or pad are possible. As one example, the conductive element may have a serrated portion adapted for contacting a conductive trace on an inner layer of the board. The serrations provide enhanced contact to the conductive pads by interfering with the exposed portion of the pad.

Figure 8:
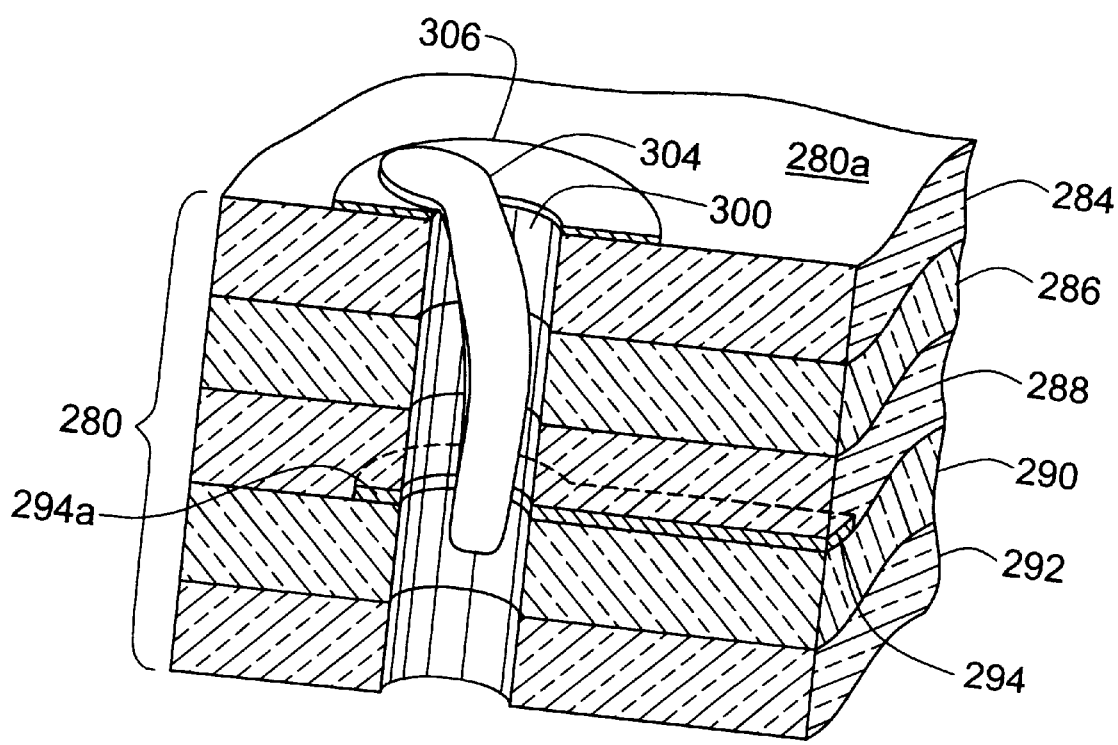
FIG. 8 is a partial cross-sectional view of a multi-layer printed circuit board having a non-conductive via with an alternative conductive element in the via according to another aspect of the invention.

Referring to FIG. 8, a multi-layer printed circuit board 280 has a plurality of stacked dielectric layers 284, 286, 288, 290, and 292, at least one of which supports a conductive trace, such as trace 294 formed on layer 290. A non-conductive via 300 extends through at least a portion of the board and intersects a pad 294a of the conductive trace 294, as shown.

The non-conductive via 300 is adapted to receive a conductive element, here in the form of a stripe 304 of a conductive material. Suitable materials for the conductive stripe 304 include a conductive paint, polymer, metal, or fusible conductive polymer ceramic. The conductive material may take various forms, such as a compliant, conductive "donut" pressed into the hole.

The conductive stripe 304 extends between the signal trace 294 and a pad 306 on a surface 280a of the board. An electrical component having a contact tail electrically coupled to the pad 306, such as by a surface mount solder connection, is electrically connected to the conductive trace 294 through the conductive stripe 304.

It should be appreciated that the number of layers of the illustrated multi-layer printed circuit boards is selected for simplicity of illustration and is not a limitation on the invention. However, the invention will be most useful with thicker boards carrying high speed signals. For example, at 3 Gigabits per second, a signal has a significant frequency component at 7 GHz. A stub of 5 mm long presents a quarter wavelength stub at this frequency. Thus, a 5 mm stub creates a noticeable problem at rates of 4 Gigabits per second and an extreme problem at rates of between 5 and 10 Gigabits. Thus, the invention will typically be used in applications in which high speed signals of greater than approximately 2.5 Gigabits per second are carried by boards having a thickness of greater than approximately 5 mm.

Having described the preferred embodiments of the invention, it will now become apparent to one of ordinary skill in the art that other embodiments incorporating their concepts may be used.

As one example, any of the above-described non-conductive vias may be provided with a coating of polymer or other soft insulating material containing carbon, silver or other conductive particles along the walls of the via. Insertion of a conductive element into such a coated via causes the coating to compresses in the area of the inner layer pad in order to form a low resistance (<10 ohm) connection between the conductive element and pad, while maintaining a higher resistivity in other areas along the walls of the non-conductive via. The remaining, uncompressed coating, has a significantly higher resistance, such as on the order of 100 ohms per square. This coating creates a stub that is far less disruptive to high speed signals. Even if the resistivity of the coating does not go down when compressed, the path between the conductive element and trace would be so small that it would have a low resistance whereas the rest of the path would be longer and thus, would have a higher resistance.

As another example, as mentioned above, the conductive traces and pads formed on inner layers of the board may be split in order to accommodate multiple signals, signal pairs, or signal and ground combinations. In these embodiments, the conductive element inserted into the non-conductive via is likewise split in order to provide isolated electrical connection to the split traces.

As still another example, it will be appreciated by those of ordinary skill in the art that, in addition to providing for direct electrical connection between an electrical component and an inner layer trace, the non-conductive vias and conductive elements of the invention may be used to interconnect conductive traces on interior circuit board layers. Such a structure might be used in place of a traditional buried via. With reference to FIG. 2 for example, the non-conductive via 54 may intersect a pad of a conductive trace on layer 40 as well as the pad 44a of the trace 44 on layer 38 and the contact 60 may be configured and inserted into the non-conductive via so as to contact the two pads.

It is felt therefore that these embodiments should not be limited to disclosed embodiments but rather should be limited only by the spirit and scope of the appended claims:

All publications and references cited herein are expressly incorporated herein by reference in their entirety.

What is claimed is:

1. A printed circuit board comprising:
   a plurality of stacked dielectric layers;
   a conductor disposed between two of said plurality of dielectric layers;
   a non-conductive via having a substantially uniform diameter portion extending through at least a portion of at least two of said plurality of dielectric layers, wherein an edge of said conductor is substantially flush with a wall of said non-conductive via; and
   a conductive element extending into the non-conductive via to contact said edge of said conductor, wherein said conductive element terminates within said non-conductive via, proximate to said conductor.

2. The printed circuit board of claim 1 further comprising a low conductivity particulate material disposed on an inner surface of the non-conductive via, said low conductivity material being compressed in a region adjacent the conductive element, thereby forming an electrical connection between said conductive element and said conductor.

3. The printed circuit board of claim 1 wherein at least a portion of said conductive element has a diameter greater than or equal to the diameter of said non-conductive via.

4. The printed circuit board of claim 1 wherein said conductive element is a contact of an electrical component.

5. The printed circuit board of claim 1 wherein said electrical component is a connector.

6. The printed circuit board of claim 1 wherein said conductive element has an eye-of-the-needle portion.

7. The printed circuit board of claim 1 wherein said conductive element has a serrated portion.

8. The printed circuit board of claim 1 further comprising a second conductor disposed on one of said plurality of dielectric layers, wherein said conductive element has a first portion adapted to contact said conductor and a second portion electrically isolated from said first portion and adapted to contact said second conductor.

9. The printed circuit board of claim 1 wherein said conductive element is comprised of a selected one of a conductive paint or polymer.

10. The printed circuit board of claim 1 wherein said non-conductive via extends through all of said plurality of dielectric layers.

11. The printed circuit board of claim 1 wherein said non-conductive via extends through only a portion of said plurality of dielectric layers.

12. The printed circuit board of claim 1 wherein said non-conductive via has a first portion intersecting said conductor and a second portion disposed between said first portion and a surface of the board, wherein said second portion has a larger diameter than said first portion.

13. The printed circuit board of claim 12 further comprising a conductive element having a first portion extending into said first portion of said via to contact said conductor and a second portion press-fit into said second portion of said via.

14. A printed circuit board comprising:

a plurality of stacked dielectric layers;

a conductor disposed on at least one of said plurality of dielectric layers;

a non-conductive via extending through at least a portion of said plurality of dielectric layers to intersect said conductor;

a conductive element extending into at least a portion of the non-conductive via to contact said conductor; and a low conductivity particulate material disposed on an inner surface of the non-conductive via, said low conductivity material being compressed in a region adjacent the conductive element, thereby forming an electrical connection between said conductive element and said conductor.

* * * * *

UNITED STATES PATENT AND TRADEMARK OFFICE
CERTIFICATE OF CORRECTION

PATENT NO. : 6,593,535 B2
DATED : July 15, 2003
INVENTOR(S) : Mark W. Gailus

It is certified that error appears in the above-identified patent and that said Letters Patent is hereby corrected as shown below:

Column 7,
Line 16, reads "prevent" and should read -- to prevent --.

Column 8,
Line 45, reads "optimize" and should read -- to optimize --.

Column 9,
Line 14, reads "a portion both" and should read -- a portion of both --.

Column 10,
Line 10, reads "to compresses" and should read -- to compress --.

Column 11,
Line 6, reads "of claim 1" and should read -- of claim 4 --.

Column 12,
Line 24, reads "adjacent the" and should read -- adjacent to the --.

Signed and Sealed this

Twenty-fifth Day of November, 2003

JAMES E. ROGAN
*Director of the United States Patent and Trademark Office*